(12) United States Patent
Nemoto

(10) Patent No.: US 6,465,874 B2
(45) Date of Patent: Oct. 15, 2002

(54) POWER SEMICONDUCTOR RECTIFIER HAVING SCHOTTKY CONTACT COMBINED WITH INSULATION FILM

(75) Inventor: Michio Nemoto, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/730,020

(22) Filed: Dec. 5, 2000

(65) Prior Publication Data

US 2001/0015445 A1 Aug. 23, 2001

(30) Foreign Application Priority Data

Dec. 13, 1999 (JP) .............................. 11-352616

(51) Int. Cl.[7] .......................................... H01L 31/0352
(52) U.S. Cl. ...................................... 257/653; 257/475
(58) Field of Search ................................ 257/475, 653, 257/471, 267, 268; H01L 29/861

(56) References Cited

U.S. PATENT DOCUMENTS

| | | | |
|---|---|---|---|
| 4,641,174 A | | 2/1987 | Baliga ........................ 357/58 |
| 5,278,443 A | * | 1/1994 | Mori et al. .................. 257/475 |
| 5,430,323 A | * | 7/1995 | Yamazaki et al. .......... 257/471 |
| 5,608,244 A | * | 3/1997 | Takahashi ................... 257/267 |
| 6,252,288 B1 | * | 1/2001 | Chang ........................ 257/471 |

FOREIGN PATENT DOCUMENTS

| | | | |
|---|---|---|---|
| JP | 4-236463 A | 8/1992 | |
| JP | 7-147418 A | 6/1995 | |
| JP | 10-178186 A | 6/1998 | |
| JP | 02000049361 A | * 2/2000 | ......... H01L/29/861 |

* cited by examiner

Primary Examiner—David Nelms
Assistant Examiner—Thinh Nguyen
(74) Attorney, Agent, or Firm—Rossi & Associates

(57) ABSTRACT

A semiconductor device has improved reverse recovery characteristics and has greatly reduced the leakage current caused during application of a reverse bias voltage. The semiconductor device according to the invention includes a semiconductor chip having a first major surface and a second major surface facing opposite to the first major surface; an anode electrode on the first major surface; and a cathode electrode on the second major surface. The semiconductor chip includes a first laminate structure, a second laminate structure and a third laminate structure arranged in parallel to each other, the second laminate structure being interposed between the first laminate structure and the third laminate structure. The first laminate structure, the second laminate structure and the third laminate structure commonly possess a cathode layer of a first conductivity type contacting the cathode electrode and a drift layer of the first conductivity type on the cathode layer, the drift layer being doped more lightly than the cathode layer.

17 Claims, 12 Drawing Sheets

POWER SEMICONDUCTOR RECTIFIER HAVING SCHOTTKY CONTACT COMBINED WITH INSULATION FILM

FIELD OF THE INVENTION

The present invention relates to semiconductor devices such as semiconductor rectifying devices for electric power use.

BACKGROUND

Semiconductor rectifying devices such as diodes are used in various semiconductor apparatuses, such as inverters. The semiconductor rectifying devices are used widely from small- or medium-capacity semiconductor apparatuses, which have a breakdown voltage of about 600 V or less, to high-capacity semiconductor apparatuses, which have a breakdown voltage of about 2.5 kV or more. Recently, switching devices, represented by IGBT's (insulated gate bipolar transistors), that work at high frequencies with low switching losses have been developed and are used in the high-breakdown-voltage and high-capacity field. Especially in the field of high-capacity use, GTO's (gate turnoff thyristors) have been replaced by IGBT's. In association with this replacement, it has been required for the diodes to exhibit high-speed recovery characteristics. In addition, it has also been required for the diodes to operate at high frequencies with low switching loss and to exhibit soft recovery characteristics for reducing EMI noises caused by the diodes operating in power electronics instruments.

A p-i-n diode, that is, a representative semiconductor rectifying device used widely in these days, typically includes an n-type drift layer (i-layer) for securing a high breakdown voltage between a p$^+$-type anode layer contacting an anode electrode and an n$^+$-type cathode layer contacting a cathode electrode. The specific resistance of the n$^-$-type drift layer is higher than the specific resistance of the anode layer and the specific resistance of the cathode layer.

FIG. 4 is a cross-sectional view of a conventional p-i-n diode. Referring to FIG. 4, the conventional p-i-n diode includes an n$^-$-type drift layer 2 with high specific resistance, an n$^+$-type cathode layer 3 contacting a cathode electrode 5 on a major surface of n$^-$-type drift layer 2 and a p$^+$-type anode layer 1 contacting an anode electrode 4 on another major surface of n$^-$-type drift layer 2.

While the diode is switching from the ON-state to the OFF-state (during the reverse recovery process), a high transient current (hereinafter referred to as a "reverse recovery current") flows in the opposite direction through the diode. When a reverse recovery current flows, an electric loss (hereinafter referred to as a "reverse recovery loss") larger than the electric loss caused in the steady state is caused in the diode. There is a great need for a diode capable of reducing the reverse recovery loss. The reverse recovery process causes an electrical burden heavier than that in the steady state. As the steady state current or the reverse blocking voltage is increased, the electrical burden increases, which tends to cause a breakdown of the diode. To provide a highly reliable diode for electric power use, it would be highly advantageous to increase capability of a diode to withstand reverse recovery such that it is higher than its capability to withstand the rated current.

The minority carrier lifetime is controlled, in these days, by using heavy metal diffusion or electron beam irradiation to improve the reverse recovery characteristics and the reverse recovery withstanding capability of a diode. Since the total carrier concentration in the steady state is reduced by shortening the carrier lifetime, the carrier concentration swept out during the reverse recovery process by the expansion of the space charge region, the reverse recovery period, the peak reverse recovery current and the reverse recovery electric charges are reduced. Since the high electric field caused by the holes flowing through the space charge region is relaxed by reducing the hole concentration, the electrical burden is reduced and the reverse recovery withstanding capability is thereby improved. A merged p-i-n/Schottky diode (hereinafter referred to as an "MPS"), which reduces the injection efficiency of the minority carriers for improving the reverse recovery characteristics, has been developed (cf. U.S. Pat. No. 4,641,174 issued Feb. 3, 1987).

FIG. 5 is a cross-sectional view of a conventional MPS diode. Referring to FIG. 5, the conventional MPS diode includes an n$^-$-type drift layer 2 with high specific resistance, an n$^+$-type cathode layer 3 contacting a cathode electrode 5 on a major surface of n$^-$-type drift layer 2, a p$^+$-type anode layer 1 contacting an anode electrode 4 in a portion of another major surface of n$^-$-type drift layer 2, and a Schottky junction 7 formed between n$^-$-type drift layer 2 and anode electrode 4 in parallel to p$^+$-type anode layer 1.

Japanese Unexamined Laid Open Patent Application H05-218389 discloses a parallel arrangement of a Schottky junction and a p-i-n structure that facilitates reducing the carrier concentration without controlling the carrier lifetime, thus reducing the peak reverse recovery current, reducing the reverse recovery electric charges, and improving the reverse recovery withstanding capability.

One important parameter involved in addition to the reverse recovery characteristics is the temperature coefficient of the forward voltage in the ON-state of the diode. The temperature coefficient of the forward voltage indicates whether the forward voltage at a high temperature is higher or lower, around the rated current, than the forward voltage at the room temperature. The temperature coefficient is positive when the forward voltage at a high temperature is higher than the forward voltage at room temperature, and is negative when the forward voltage at a high temperature is lower than the forward voltage at room temperature. Preferably, the temperature coefficient of the forward voltage is positive.

The current balance in the diode chip, between the diode chips and the diode modules, explains why the positive temperature coefficient of the forward voltage is preferable. When a current localizes in a specific region of a diode chip, the temperature of the specific region rises locally. When the temperature coefficient of the forward voltage is positive, the resistance of the specific portion rises with increasing temperature, relaxing the current localization. When the temperature coefficient of the forward voltage is negative, the resistance of the specific region lowers with increasing temperature, causing further current localization. An imbalance is thus caused in the current flowing through a diode chip, between the currents flowing through diode chips or between the currents flowing through diode modules. At present, multiple diode chips or multiple diode modules are operated, in many cases, in unison for high breakdown voltage use or for high capacity use. Therefore, the temperature coefficient of the forward voltage is preferably positive to achieve well-balanced operations of the diode chip, the diode chips and the diode modules.

The reverse recovery characteristics and the capability of the p-i-n diode to withstand reverse recovery is improved by reducing the impurity concentration in the anode layer. Reducing the concentration of impurities in the anode layer is effective to suppress the peak reverse recovery current. However, the integral impurity concentration in the p$^+$-type anode layer should be maintained at a level of $3\times10^{12}$ cm$^{-2}$ or more to obtain a certain breakdown voltage. Therefore, the integral impurity concentration in the p$^+$-type anode layer should not be reduced below $3\times10^{12}$ cm$^{-2}$. Moreover, reducing the integral impurity concentration in the anode layer has the disadvantage of increasing the forward voltage when a high current (about 500 A cm$^{-2}$ or higher) flows during the application of forward bias voltage. This problem is caused by the reduced impurity concentration, since the minority carriers injected are thus reduced. Although it is necessary to control the minority carrier lifetime to increase reverse recovery speed, the temperature coefficient of the forward voltage tends to be negative when the minority carrier lifetime is shortened by intensified electron beam irradiation. The negative temperature coefficient of the forward voltage is caused at high temperature (usually about 125° C.) by the carriers exiting from the traps at a rate higher by the Boltzmann factor $e^{-\Delta E/KT}$ than those at room temperature and by the narrowed capture cross-section of the carriers at high temperature. Therefore, it is difficult at present for the p-i-n diode including an anode layer, in which the impurity concentration is reduced, to improve the reverse recovery characteristics and to achieve a positive temperature coefficient in the forward voltage.

A means for reducing the hole injection efficiency, such as the MPS described above and a static shielding diode (hereinafter referred to as an "SSD"), is capable of improving the reverse recovery characteristics and achieving a positive temperature dependence on forward voltage. Since the MPS and the SSD suppress the hole injection in the ON-state thereof, the carrier concentration therein can be reduced. As a result, the peak reverse recovery current or the reverse recovery electric charges are reduced, and carrier lifetime control may be moderated or eliminated. However, since the MPS includes a Schottky junction in the chip thereof, in addition to the p-i-n structure, the leakage current from the Schottky junction increases in the OFF-state of the diode (when a reverse bias voltage is applied), especially at a high temperature. The leakage current increase is caused by the lowering of barrier height across the Schottky junction. The leakage current increase also occurs in a soft and fast recovery diode (hereinafter referred to as an "SFD"), since the SFD also includes a Schottky junction. The leakage current is small in the SSD, since the SSD includes not a Schottky junction but a thin p$^-$-type layer. However, the SSD does not improve the reverse recovery characteristics as compared with the MPS, since holes are injected from the thin p$^-$-type layer when a forward bias voltage is applied.

Japanese Unexamined Laid Open Patent Application H09-136253 discloses a diode structure, including a patterned silicon oxide film and an insulation film on the anode surface, which improves the ability to withstand forward surge current and reverse recovery characteristics. However, it is difficult for the structure disclosed in this patent application to improve the reverse recovery characteristics significantly more than the p-i-n diode, since the disclosed structure forces the side of the anode to accumulate carriers to improve the forward surge current withstanding capability. Since the oxide insulation film blocks the accumulation of carriers in its vicinity, the accumulated carriers increase the peak reverse recovery current Jpr during reverse recovery.

Japanese Unexamined Laid Open Patent Application H07-147418 discloses a diode structure that includes a patterned p$^+$-type anode layer and an oxide film between the anode electrode and the n-type drift layer to improve the reverse recovery characteristics and to reduce the reverse leakage current. FIG. 6 is a cross-sectional view of the diode (hereinafter referred to as the "SD") disclosed in the above identified Patent Application H07-147418. Referring to FIG. 6, the SD includes an n$^+$-type cathode layer 3, a highly resistive n$^-$-type drift layer 2 on n$^+$-type cathode layer 3, a p$^+$-type anode layer 1 in a part of the surface portion of n-type drift layer 2, an anode electrode 4 in contact with p$^+$-type anode layer 1, and an insulation film 6 between n$^-$-type drift layer 2 and anode electrode 4 and in parallel to p$^+$-type anode layer 1.

The SD, which eliminates the Schottky junction from the conventional MPS by completely covering the n$^-$-type drift layer-Schottky junction region with an oxide film, facilitates a greater reduction in the leakage current caused during the reverse recovery than the MPS does. However, carriers are accumulated in the surface portion of n$^-$-type layer below the oxide film in the SD due to the same reason described in connection with the diode structure disclosed in the foregoing Japanese Unexamined Laid Open Patent Application H09-136253. Therefore, it is difficult for the SD to improve the reverse recovery characteristics in the same way as the MPS does.

SUMMARY OF THE INVENTION

In view of the foregoing, it is an object of the invention to provide a semiconductor device that obviates the problems described above. It is another object of the invention to provide a semiconductor device that improves reverse recovery characteristics and greatly reduces the leakage current caused during the application of a reverse bias voltage.

According to one aspect of the invention, there is provided a semiconductor device including: a semiconductor chip having a first major surface, a second major surface facing opposite to the first major surface; an anode electrode on the first major surface; and a cathode electrode on the second major surface. The semiconductor chip of the invention includes a first laminate structure, a second laminate structure and a third laminate structure arranged in parallel to each other, the second laminate structure being interposed between the first laminate structure and the third laminate structure; the first laminate structure, the second laminate structure and the third laminate structure commonly possessing a cathode layer of a first conductivity type contacting with the cathode electrode and a drift layer of the first conductivity type on the cathode layer, the drift layer being doped more lightly than the cathode layer. The first laminate structure further includes an anode layer of a second conductivity type on the drift layer, the anode layer being doped more heavily than the drift layer and contacting the anode electrode. The second laminate structure further includes a Schottky junction between the drift layer and the anode electrode, and the third laminate structure further including an insulation film between the drift layer and the anode electrode.

When a forward bias voltage is applied to the anode electrode, electrons flow from the cathode layer of the first conductivity type (n$^+$-type cathode layer) to the Schottky junction in the second laminate structure, and the built-in potential thereof is the lowest. As the forward bias voltage exceeds the built-in potential of the Schottky junction, holes are injected from the anode layer of the second conductivity type (p$^+$-type anode layer). As the current flowing through the semiconductor device (diode) increases, the hole current component of the total current increases. Since the holes as the minority carriers are not injected basically from the Schottky junction when the rated current is flowing, the carrier concentration in the vicinity of the Schottky junction in the second laminate structure is much smaller than the carrier concentration in the same depth of the first laminate structure. Therefore, the efficiency of hole injection from the anode electrode is reduced. Since the second laminate structure (the Schottky junction region) is interposed between the first laminate structure and the third laminate structure, the holes injected from the anode layer of the second conductivity type ($p^-$-type anode layer) hardly reach the third laminate structure. As a result, the carrier concentration in the vicinity of the oxide film in third laminate structure is extremely small, although the oxide film is in third laminate structure. When the width of the second laminate structure is significantly less than the carrier diffusion length, holes reach the third laminate structure, even though the Schottky junction is in second laminate structure. In this case, the hole injection efficiency and, therefore, the carrier concentration are not reduced.

When a reverse bias voltage is applied to the diode, depletion layers expand from the pn-junction and the Schottky junction. The leakage current from the Schottky junction is determined mainly by the current value based on the theory of thermionic emission and the increment of the current caused by the barrier height lowering, which depends on the electric field strength in the vicinity of the junction plane. By covering a part of the Schottky junction, especially the region wherein a strong electric field is caused, with an oxide film according to the invention, the reverse leakage current therefrom is reduced, and the efficiency of hole injection from the anode electrode is suppressed at a low level.

Since the efficiency of hole injection from the anode electrode is suppressed as low as that of the MPS, the concentration of the holes flows through the space charge region formed in the first laminate structure (pn-junction region), especially when the current changes its direction during reverse recovery and, therefore, the peak reverse recovery current is reduced. Since the total carrier concentration is reduced more greatly than in the p-i-n diode, the reverse recovery charges are reduced. As a result, the peak reverse recovery current Jpr is reduced, resulting in a soft recovery.

Advantageously, the third laminate structure further includes a float layer of the second conductivity type between the drift layer and the insulation film, the float layer being doped more heavily than the drift layer. The float layer is not in contact with the anode electrode, but floats electrically from the anode electrode. Also advantageously, the third laminate structure further includes a float layer of the second conductivity type between the drift layer and the insulation film, the float layer being doped more heavily than the drift layer, a part of the float layer being in contact with the anode electrode. Since a depletion layer expands also from the float layer of the second conductivity type ($p^+$-type float layer) beneath the insulation film (oxide film) when a reverse bias voltage is applied, a stronger pinching-off effect is caused and the electric field around the Schottky junction is further relaxed.

Advantageously, the first laminate structure and the second laminate structure distribute in a stripe pattern. Further, the second laminate structure and the third laminate structure also advantageously distribute in a stripe pattern. In another preferred embodiment, the first laminate structure and the second laminate structure are distributed in a dot cell pattern. Also, preferably, the second laminate structure and the third laminate structure are distributed in a dot cell pattern.

Advantageously, the area $W_S$ of the second laminate structure in the first major surface and the area $W_{OX}$ of the third laminate structure in the first major surface are related with each other by the following relational expression (1):

$$0.2 < W_S/(W_S+W_{OX}) \tag{1}$$

Since the peak reverse recovery current Jpr is reduced and almost independent of the area ratio $W_S/(W_S+W_{OX})$ when the area ratio $W_S/(W_S+W_{OX})$ is 20% or more, excellent reverse recovery characteristics are obtained. When the area ratio $W_S/(W_S+W_{OX})$ is less than 20%, the peak reverse recovery current Jpr increases, since the effect of the Schottky junction is reduced and the efficiency of hole injection from the anode is increased. The reason for this is that the width of the second laminate structure is significantly less than the carrier diffusion length Lp or Ln.

Advantageously, the area $W_P$ of the first laminate structure in the first major surface, the area $W_S$ of the second laminate structure in the first major surface and the area $W_{OX}$ of the third laminate structure in the first major surface, are related to each other by the following relational expression:

$$W_P/(W_P+W_S+W_{OX}) \leq 0.75 \tag{2}$$

Since the peak reverse recovery current Jpr is sufficiently small when the area ratio $W_P/(W_P+W_S+W_{OX})$ is 75% or less, excellent reverse recovery characteristics are obtained.

Advantageously, the insulation film is a silicon oxide film. Preferably, the silicon oxide film is from about 0.01 to 1.0 micrometers in thickness.

Advantageously, the insulation film is a polyimide film. Preferably, the polyimide film is from 0.01 to 1.0 micrometers in thickness.

DETAILED DESCRIPTION OF THE PREFERRED EMBODIMENTS OF THE INVENTION

Figure 1:
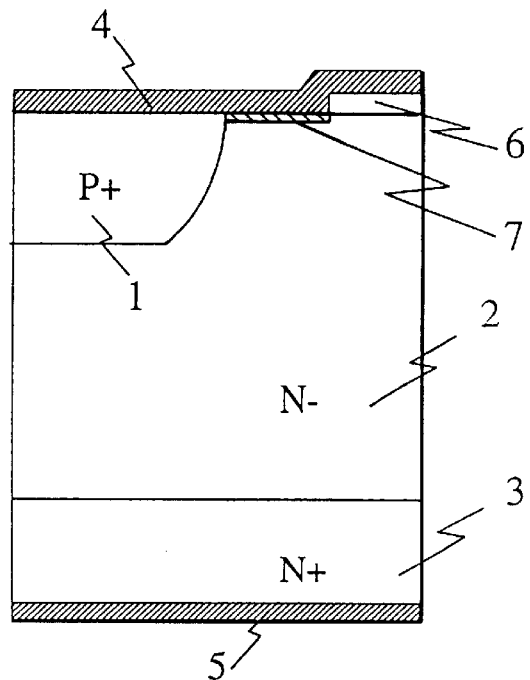
FIG. 1 is cross-sectional view of a semiconductor device according to the first embodiment of the invention.

The invention will be explained hereinafter with reference to the accompanying drawings, which illustrate the preferred embodiments of the invention. In the following, the n-type layer or the n-type region is a layer or a region in which electrons are majority carriers. The p-type layer or the p-type region is a layer or a region in which holes are majority carriers. The n$^+$-type layer and the p$^+$-type layer or the n$^+$-type region and the p$^+$-type region are layers or regions doped relatively heavily. The n$^-$-type layer and the p$^-$-type layer or the n$^-$-type region and p$^-$-type region are layers or regions doped relatively lightly. In the following embodiments, the first conductivity type is an n-type and the second conductivity type a p-type. Alternatively, the first conductivity type may be a p-type and the second conductivity type an n-type. The oxide insulation film is preferably a silicon oxide film made by thermally oxidizing silicon (hereinafter the oxide insulation film will be referred to simply an the "oxide film"). Alternatively, an electrically insulative organic film, such as a polyimide film, may be used for the insulation film. In the following descriptions, the same reference numerals are used to designate the same constituent elements.

First Embodiment

The semiconductor device according to a first embodiment of the invention will be described first. FIG. 1 is cross-sectional view of a semiconductor device according to a first embodiment of the invention. Referring to FIG. 1, the semiconductor device according to the first embodiment includes an n$^+$-type cathode layer 3; a cathode electrode 5 in contact with n$^+$-type cathode layer 3; an n-type drift layer 2 with high resistivity on n$^+$-type cathode layer 3, n$^-$-type drift layer 2 being doped more lightly than n$^+$-type cathode layer 3; a p$^+$-type anode layer 1 in a part of the surface portion of n$^-$-type drift layer 2, p$^+$-type anode layer 1 being doped more heavily than n$^-$-type drift layer 2; and an anode electrode 4 in contact with p$^+$-type anode layer 1. Hereinafter, this structure will be referred to as a first laminate structure.

In parallel to the first laminate structure, a second laminate structure, including n$^-$-type drift layer 2, anode electrode 4 and a Schottky junction 7 between n$^-$-type drift layer 2 and anode electrode 4, is formed. In parallel to the second laminate structure, a third laminate structure, including n$^-$-type drift layer 2, anode electrode 4 and an insulation film 6 between n$^-$-type drift layer 2 and anode electrode 4, is formed.

These laminate structures are arranged one by one, either in the order of first laminate structure, second laminate structure, and third laminate structure, or in the order of third laminate structure, second laminate structure, and first laminate structure. A specific feature is that the second laminate structure including a Schottky junction is interposed between the first laminate structure and the third laminate structure.

The functions of the semiconductor device (diode) according to the first embodiment will now be described. When a forward bias voltage is applied to the anode electrode, electrons flow from n$^+$-type cathode layer 3 to Schottky junction 7, in which the built-in potential is the lowest, between n$^-$-type drift layer 2 and anode electrode 4 in the second laminate structure. In this stage, most of the current flowing through the diode is an electron current component. As the forward bias voltage exceeds the built-in potential of the p$^+$-n$^-$-junction, holes are injected from p$^+$-type anode layer 1. As the total current flowing through the diode increases, the hole current component in the total current increases. At the rated current, the carrier concentration in the vicinity of Schottky junction 7 in the second laminate structure is significantly lower than the carrier concentration at the same depth of the first laminate structure, since holes as the minority carriers are basically not injected from Schottky junction 7. Due to this, the efficiency of hole injection from anode electrode 4 is reduced. The carrier concentration in the vicinity of oxide film 6 in the third laminate structure is very low, despite of the existence of the oxide film. Due to the Schottky junction region (the second laminate structure) interposed between the first laminate structure and the third laminate structure, it is hard for the holes injected from p+-type anode layer 1 to reach the third laminate structure and, therefore, the carriers accumulated below the oxide film in the diode according to the first embodiment are less than the carriers accumulated below the oxide film in the SD disclosed in Japanese Unexamined Laid Open Patent Application H07-147418. On the other hand, when the width of the second laminate structure is less than the diffusion length of the carriers, the holes can reach the third laminate structure, despite the existence of the Schottky junction. Therefore, the hole injection efficiency and the carrier concentration are not reduced.

When a reverse bias voltage is applied to anode electrode 4, depletion layers expand from Schottky junction 7 and the pn-junction. The leakage current from Schottky junction 7 is determined mainly by the current value based on the theory of thermionic emission and the increment of the current caused by the barrier height lowering, which depends on the electric field strength in the vicinity of the junction plane. The conventional MPS prevents, to some extent, the electric field strength in the vicinity of the Schottky junction from increasing by the pinching-off effect of the depletion layer expanding from the p-type layer. For obtaining this effect, it is necessary to reduce the area of the Schottky junction. However, the hole injection efficiency at the time of forward bias voltage application is raised as the Schottky junction area is reduced. The first embodiment, which covers a part of the Schottky junction, especially the area of the Schottky junction in which the electric field strength is high, with an oxide film, facilitates the reduction of reverse leakage current from Schottky junction and suppresses the efficiency of hole injection from the anode at a low value.

Since the diode according to the first embodiment of the invention reduces the efficiency of hole injection from the anode at the same level as that of the MPS, the concentration of the holes during reverse recovery, especially when the current changes its direction and a space charge region is formed in the p+-n−-junction region between the p+-type layer and the n−-type layer, flowing through the space charge region is reduced, and peak reverse recovery current is expected to be suppressed. Since the diode according to the first embodiment of the invention reduces the total carrier concentration more greatly than a p-i-n-diode, the diode according to the first embodiment facilitates the reduction of the reverse recovery current. Therefore, the peak reverse recovery current Jpr is reduced, resulting in a soft recovery.

Second Embodiment

Figures 2A, 2B:
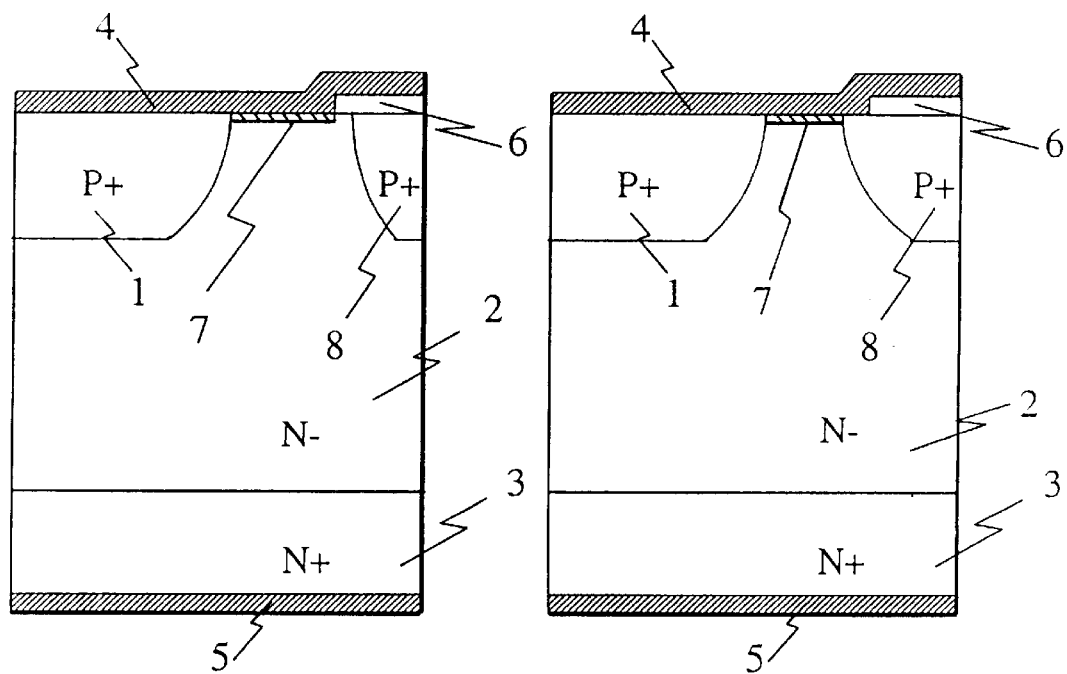
FIG. 2a is a cross-sectional view of a semiconductor device according to the second embodiment of the invention.
FIG. 2b is a cross-sectional view of a semiconductor device according to the third embodiment of the invention.
Figures 3A, 3B:
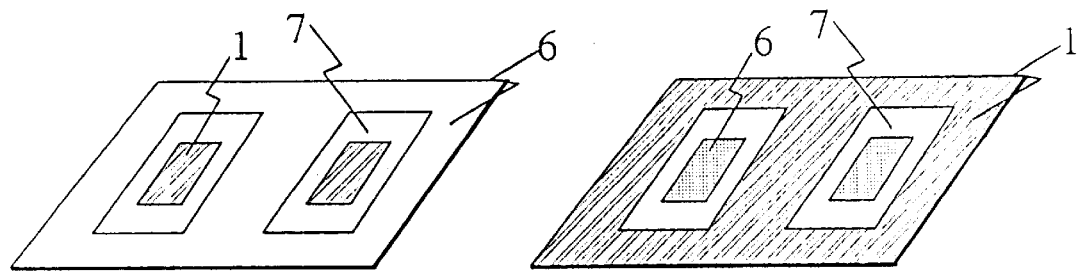
FIGS. 3a–3d show surface patterns on a semiconductor device chip.
Figures 3C, 3D:
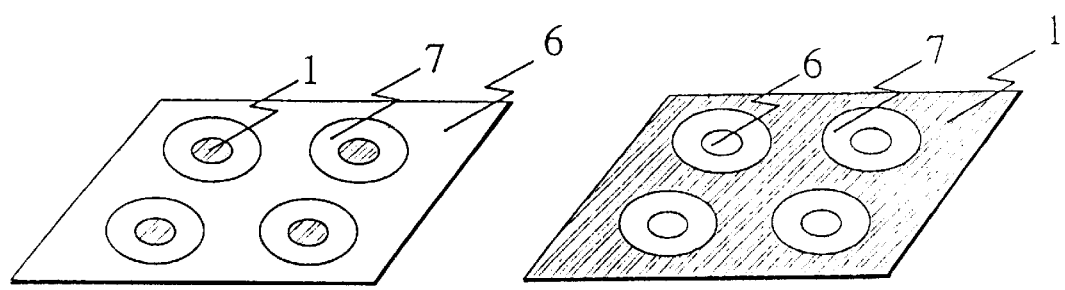
Figure 4:
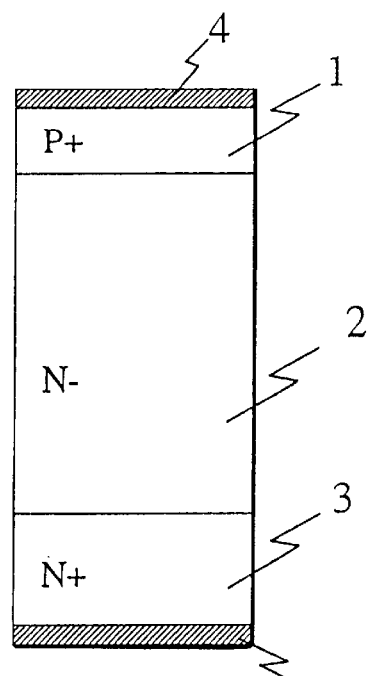
FIG. 4 is a cross-sectional view of a conventional p-i-n diode.
Figure 5:
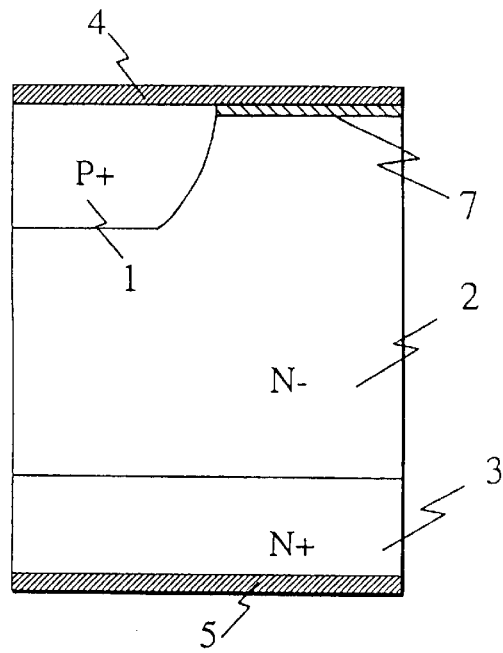
FIG. 5 is a cross-sectional view of a conventional MPS diode.
Figure 6:
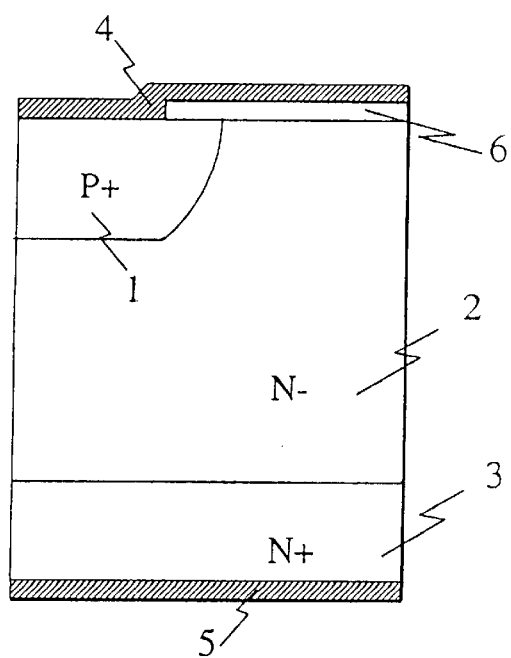
FIG. 6 is a cross-sectional view of the diode disclosed in Japanese Unexamined Laid Open Patent Application H07-147418.

FIG. 2a is a cross sectional view of a semiconductor device according to a second embodiment of the invention. Referring now to FIG. 2a, a semiconductor device according to the second embodiment of the invention further includes a p+-type float layer 8, which is not in contact with anode electrode 4. In other words, the p+-type float layer 8 is floated electrically from anode electrode 4. The other configurations are the same with those of the semiconductor device according to the first embodiment.

Third Embodiment

FIG. 2b is a cross sectional view of a semiconductor device according to a third embodiment of the invention. Referring to FIG. 2b, the semiconductor device according to the second embodiment may also include a p+-type float layer 8, a part of which may be in contact with anode electrode 4. The other configurations are the same with those of the semiconductor device according to the first embodiment. Since a depletion layer expands below oxide film 6 from p+-type float layer 8 in the semiconductor devices according to the second and third embodiments, a stronger pinching off effect is caused, and the electric field strength across the Schottky junction is further relaxed.

FIGS. 3a–3d show surface patterns on a semiconductor device chip. In the pattern shown in FIG. 3a, the first laminate structure (p-i-n region) and the second laminate structure (Schottky junction region) distribute in a stripe pattern. In the pattern shown in FIG. 3b, the second laminate structure (Schottky junction region) and the third laminate structure (oxide film region) distribute in a stripe pattern. In the pattern shown in FIG. 3c, the first laminate structure (p-i-n region) and the second laminate structure (Schottky junction region) distribute in a dot cell pattern. In the pattern shown in FIG. 3d, the second laminate structure (Schottky junction region) and the third laminate structure (oxide film region) distribute in a dot cell pattern.

Figure 7:
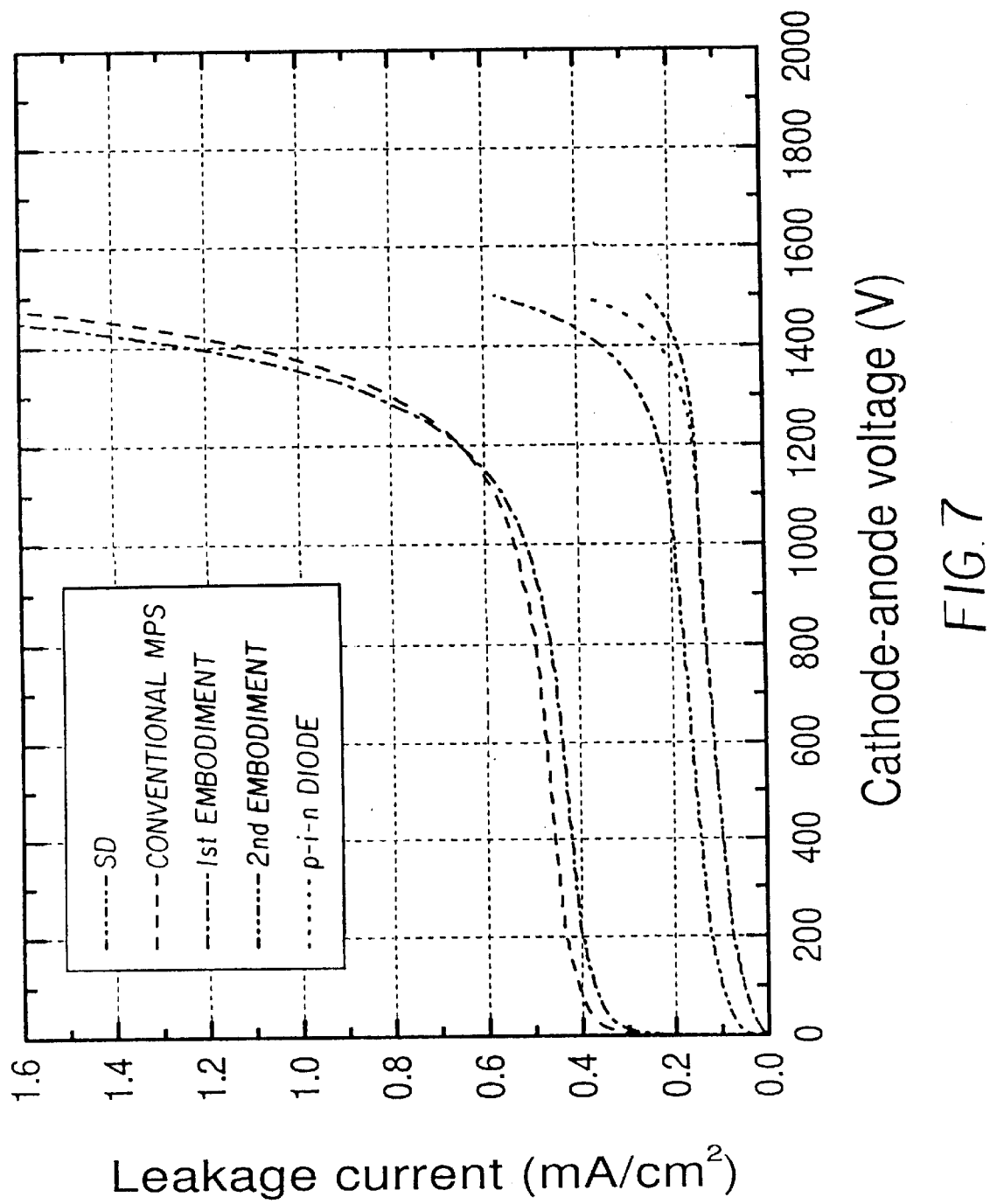
FIG. 7 shows a set of curves comparing the output characteristics at the time of reverse recovery of the conventional p-i-n diode, the conventional MPS, the SD and the semiconductor devices according to the first and the second embodiments of the invention, each including an oxide film of 0.05 micrometer in thickness or an oxide film of 1.0 micrometer in thickness and an $n^+$-type drift layer of 70 ohm-cm in specific resistivity and 120 micrometers in thickness.

FIG. 7 shows a set of curves comparing the output characteristics at the time of reverse recovery of the conventional p-i-n diode, the conventional MPS, the SD and the semiconductor devices according to the first and the second embodiments of the invention, each including an oxide film of 0.05 micrometer in thickness or an oxide film of 1.0 micrometer in thickness and an n−-type drift layer of 70 ohm-cm in resistivity and 120 micrometers in thickness. In FIG. 7, the surface impurity concentration of the p+-type anode layer in the p-i-n region is $7\times10^{17}$ cm$^{-3}$. The diffusion depth of the p+-type anode layer in the p-i-n region is 3 micrometers. The area ratio of the Schottky junction region in the conventional MPS is 50%. The area ratio of the p-i-n region in the conventional MPS is 50%. The area ratio of the Schottky junction region in the semiconductor device according to the first or second embodiment is about 25%. The area ratio of the oxide film region in the semiconductor device according to the first or second embodiment is about 25%. The area ratio of the p-i-n region in the semiconductor device according to the first or second embodiment is 50%. As FIG. 7 indicates, the reverse leakage currents in the conventional MPS and the semiconductor device according to the first embodiment are higher than those in the conventional p-i-n diode and the SD, since the conventional MPS and the semiconductor device according to the first embodiment include a Schottky junction. The reverse leakage current in the semiconductor device according to the second embodiment is smaller than that of the semiconductor device according to the first embodiment, since the electric field strength in Schottky junction 7 is relaxed by p+-type float layer 8 (cf. FIG. 8). The semiconductor device according to any of the embodiments of the invention exhibits a sufficient breakdown voltage at the specifications described above.

Figure 8B:
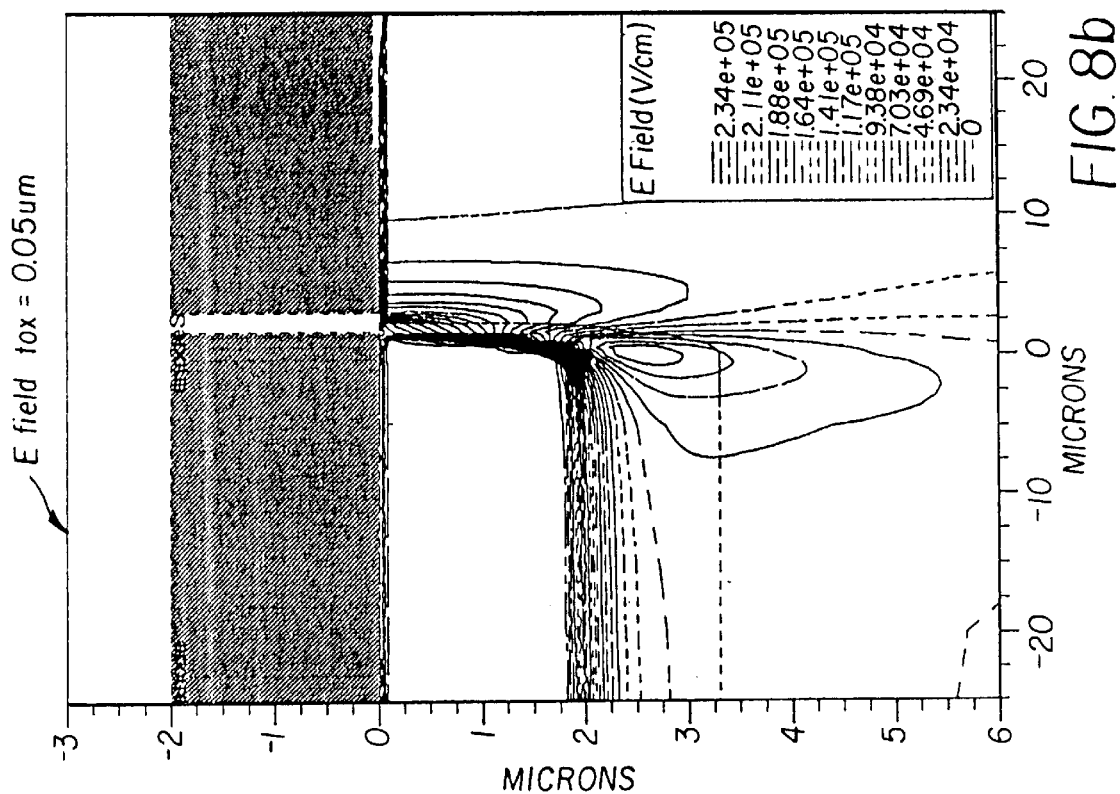
FIG. 8b shows the electric field strength distribution in the semiconductor device including an oxide film of 0.05 micrometer in thickness according to the first embodiment of the invention when a reverse bias voltage of 1200 V is applied.
Figure 8A:
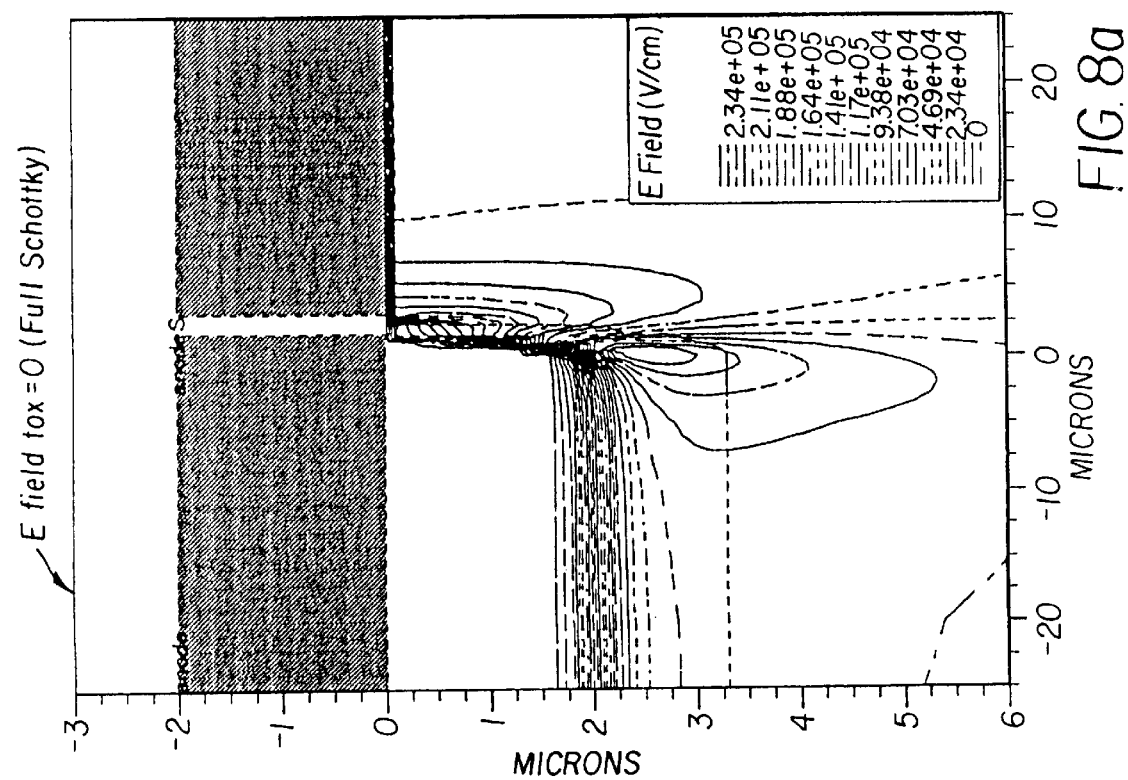
FIG. 8a shows the electric field strength distribution in the conventional MPS when a reverse bias voltage of 1200 V is applied.
Figure 8D:
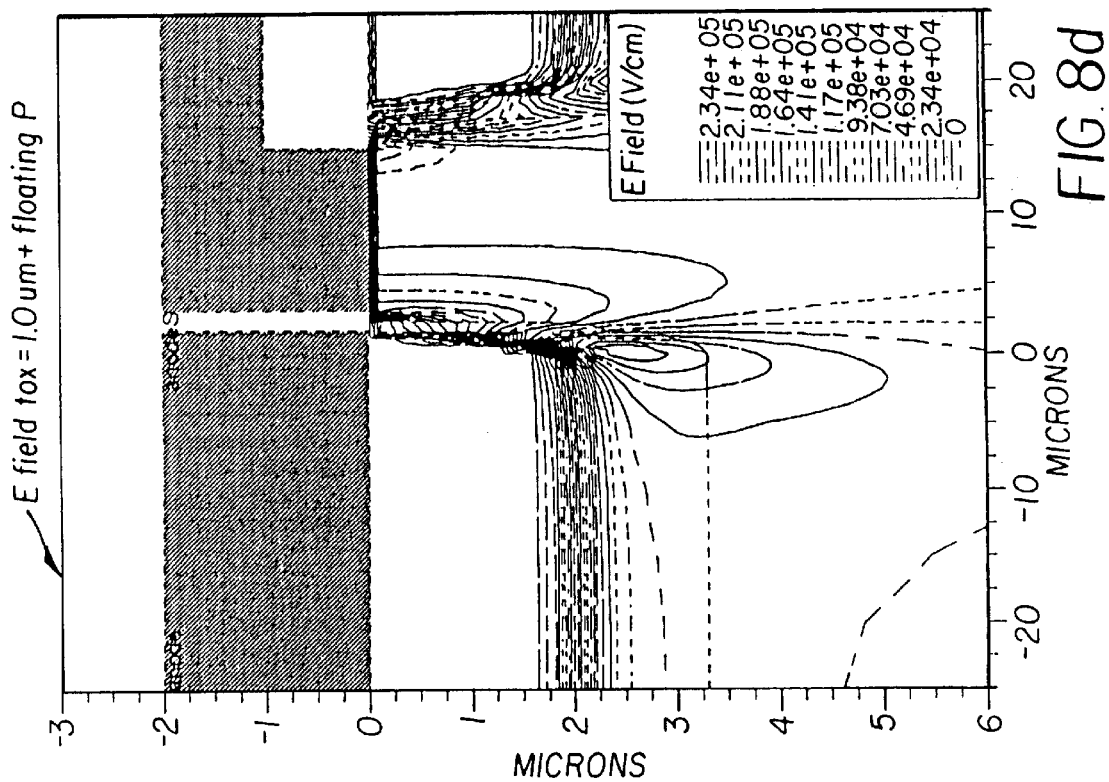
FIG. 8d shows the electric field strength distribution in the semiconductor device including an oxide film of 1.0 micrometer in thickness according to the second embodiment of the invention when a reverse bias voltage of 1200 V is applied.
Figure 8C:
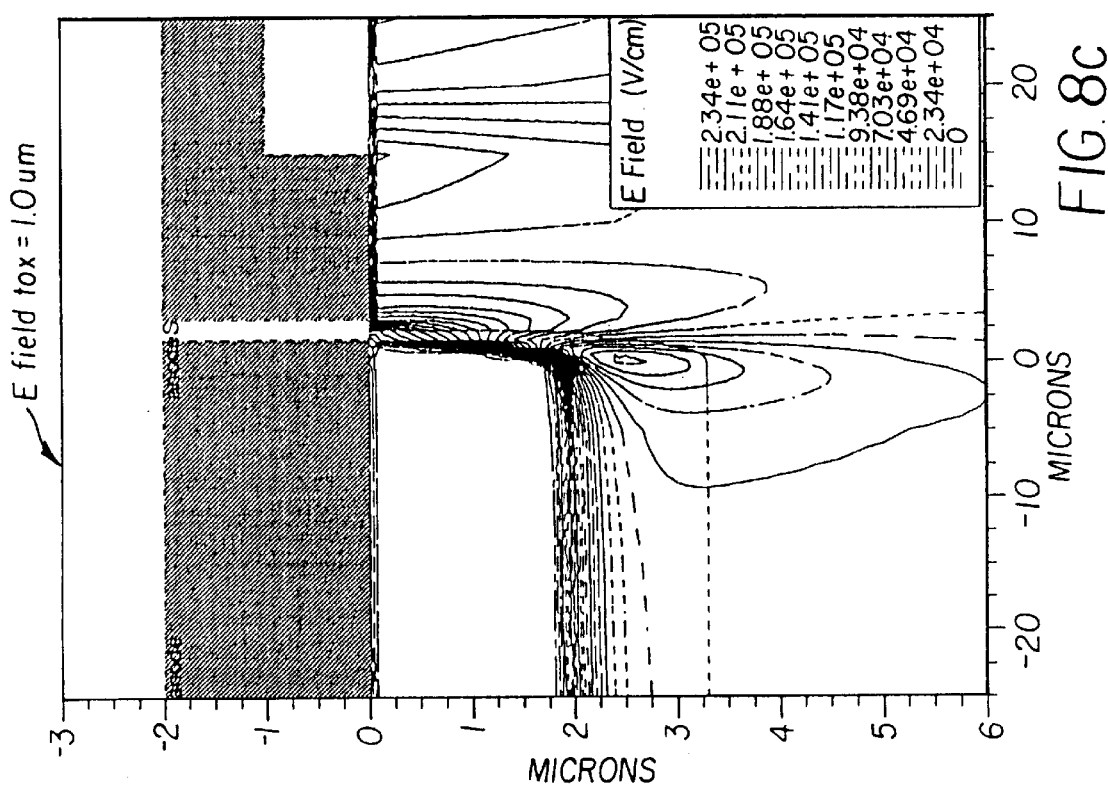
FIG. 8c shows the electric field strength distribution in the semiconductor device including an oxide film of 1.0 micrometer in thickness according to the first embodiment of the invention when a reverse bias voltage of 1200 V is applied.

FIG. 8a shows the electric field strength distribution in a conventional MPS when a reverse bias voltage of 1200 V is applied. FIG. 8b shows the electric field strength distribution in the semiconductor device including an oxide film of 0.05 micrometers in thickness according to the first embodiment of the invention, when a reverse bias voltage of 1200 V is applied. FIG. 8c shows the electric field strength distribution in the semiconductor device including an oxide film of 1.0 micrometer in thickness according to the first embodiment of the invention, when a reverse bias voltage of 1200 V is applied. FIG. 8d shows the electric field strength distribution in the semiconductor device including an oxide film of 1.0 micrometer in thickness according to the second embodiment of the invention, when a reverse bias voltage of 1200 V is applied. The electric field strength distribution in the conventional MPS and the electric field strength distribution in the semiconductor device including a thin oxide film of 0.05 Angstroms in thickness according to the first embodiment are not different from each other. When the oxide film is thick (about 1.0 micrometer), a strong electric field is caused in the boundary region between Schottky junction 7 and oxide film 6, since the curvature gradient "φ" of the equipotential curves at the edge of the oxide film is large when the oxide film is thick. However, a large electric field strength is not caused in the boundary region between Schottky junction 7 and oxide film 6 in the semiconductor device according to the second embodiment, although the oxide film thereof is thick (1.0 micrometer). This is because a depletion layer expands also from $p^+$-type float layer 8 below oxide film 6 and, therefore, the pinching-off effect of the depletion layer below Schottky junction 7 is enhanced.

Figure 9:
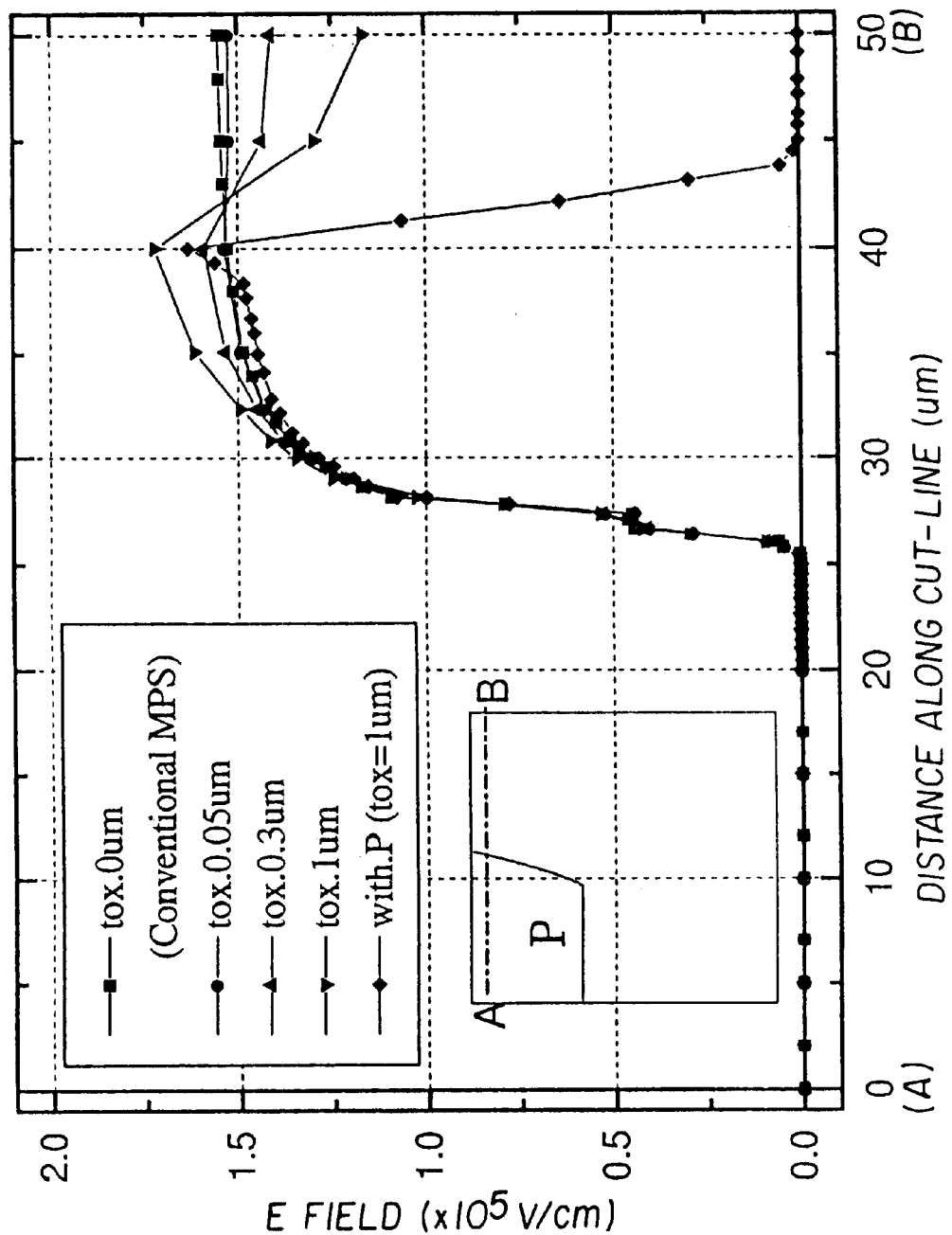
FIG. 9 shows the horizontal distributions of the electric field strength at the depth of 0.05 micrometer from the anode side surface in FIGS. 8a through 8d.

FIG. 9 shows the horizontal distributions of the electric field strength at the depth of 0.05 micrometer from the anode side surface in FIGS. 8a through 8d. As FIG. 9 indicates, the electric field strength increases, as described earlier, at the boundary (x=40 micrometers) between Schottky junction 7 and oxide film 6 as the oxide film becomes thicker. However, oxide film 6 that covers the portion of the conventional MPS, in which the electric field strength is high, prevents electrons from flowing from the portion in which the electric field strength is high. Therefore, the invention provides an effective means for suppressing the increase in reverse leakage current caused by the barrier height lowering due to the increase of the electric field strength when the reverse bias voltage is raised.

Figure 10:
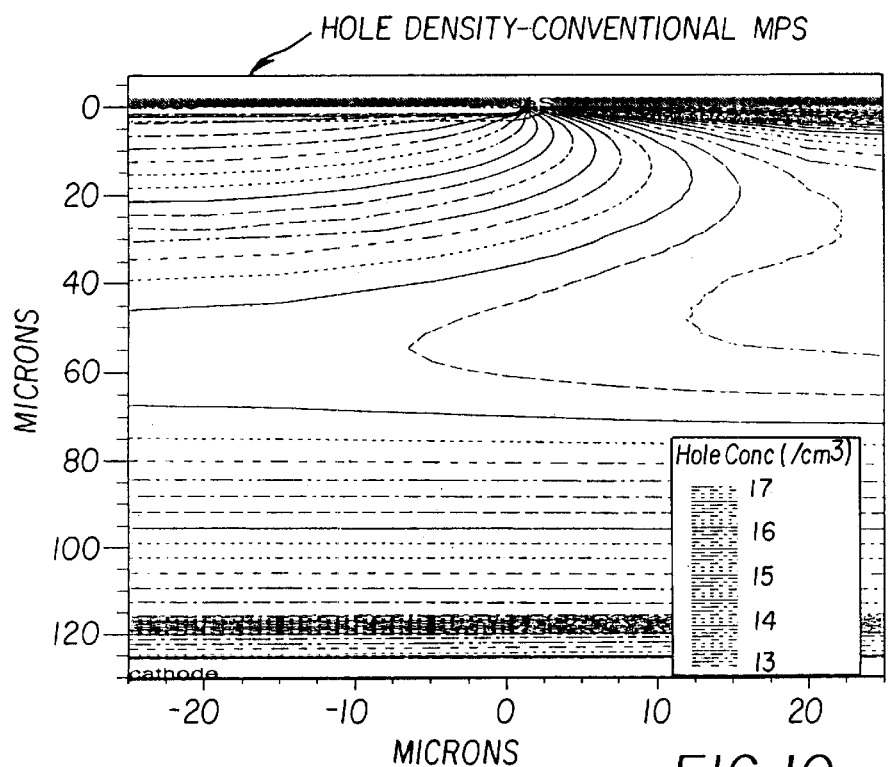
FIG. 10 shows the hole concentration distribution in the conventional MPS at the forward current density of 200 Angstroms/cm$^3$.
Figure 11:
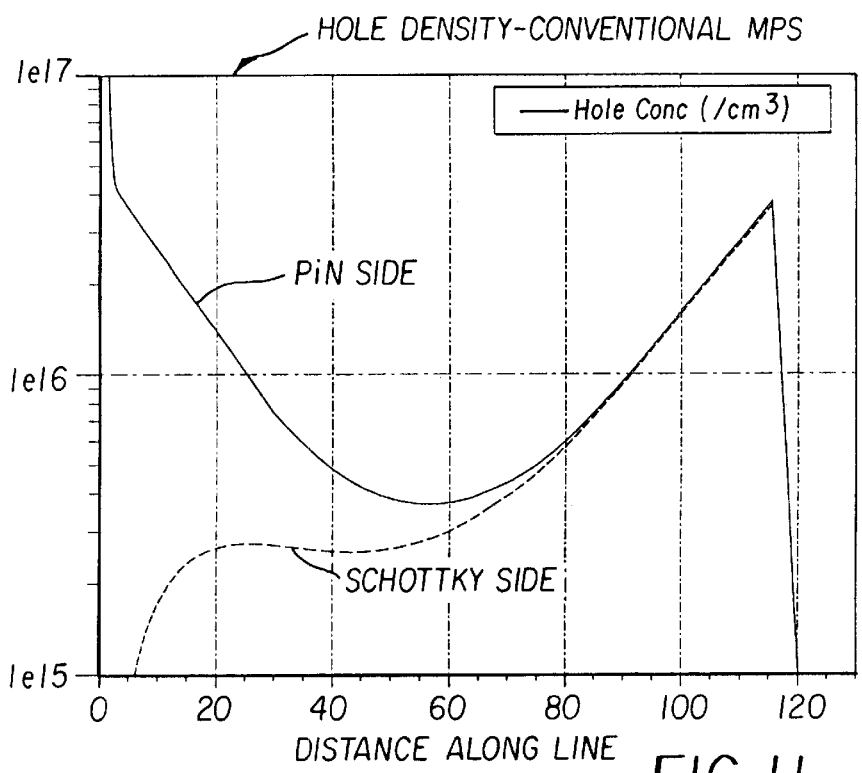
FIG. 11 shows the hole concentration distributions in FIG. 10 in the vertical cross-section including the p-i-n region and the Schottky junction.
Figure 12:
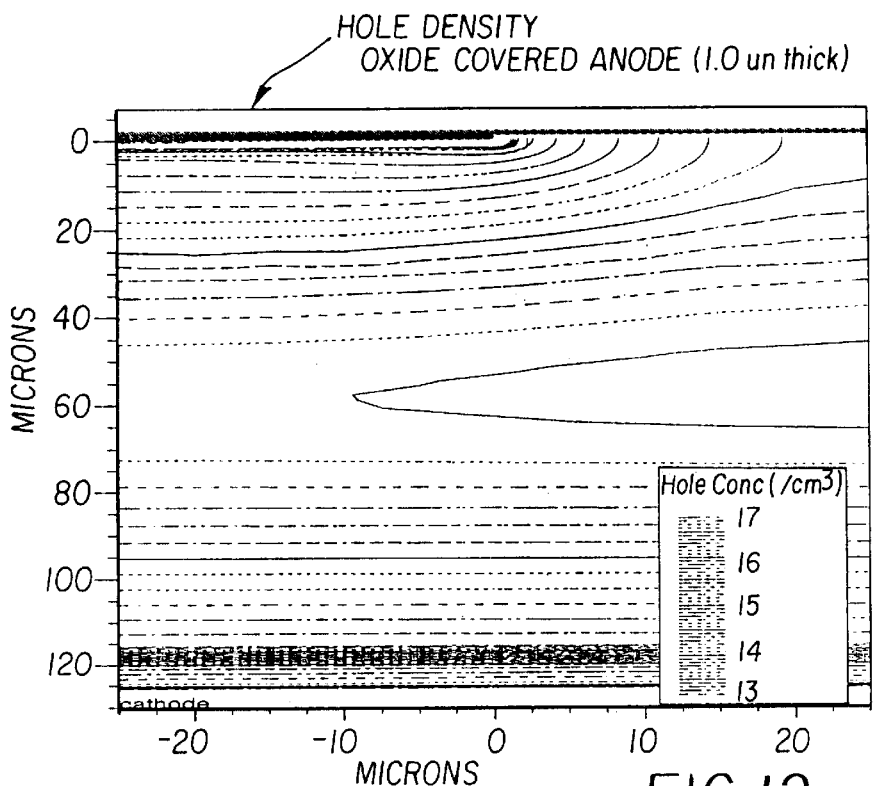
FIG. 12 shows the hole concentration distribution in the SD at the forward current density of 200 Angstroms/cm$^3$.
Figure 13:
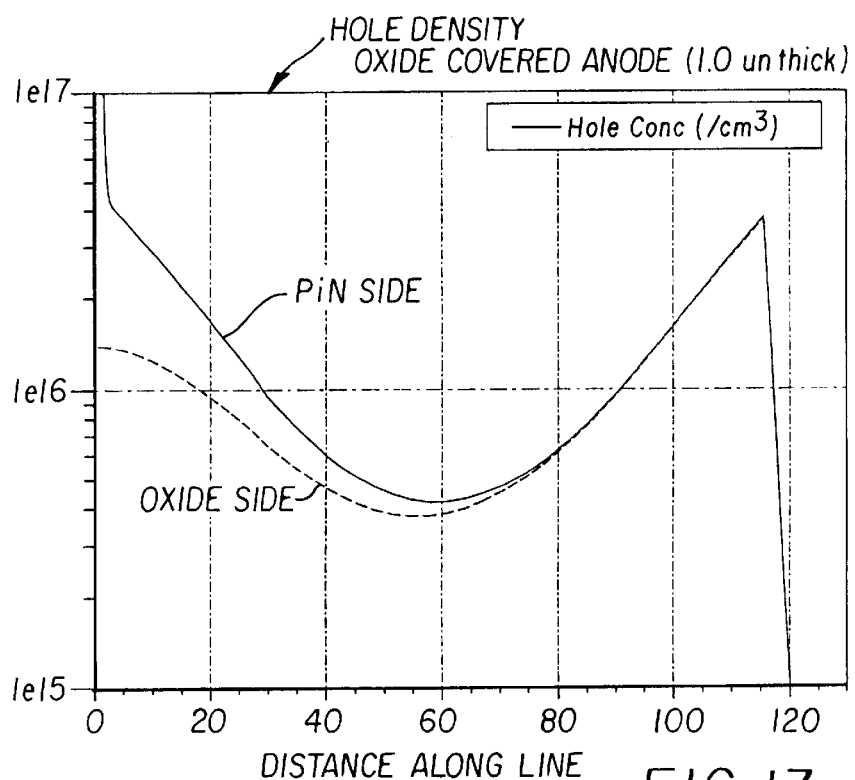
FIG. 13 shows the hole concentration distributions in FIG. 12 in the vertical cross-section including the p-i-n region and in the vertical cross-section including the oxide film.
Figure 14:
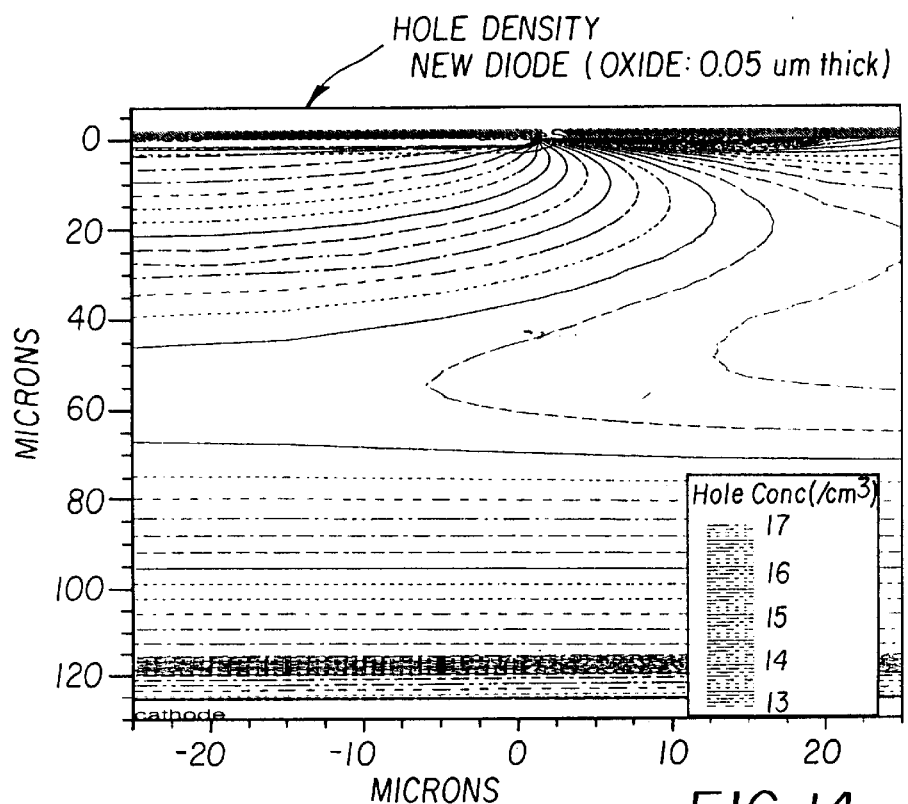
FIG. 14 shows the hole concentration distribution in the semiconductor device including an oxide film of 0.05 micrometer in thickness according to the first embodiment of the invention at the forward current density of 200 Angstroms/cm$^3$.
Figure 15:
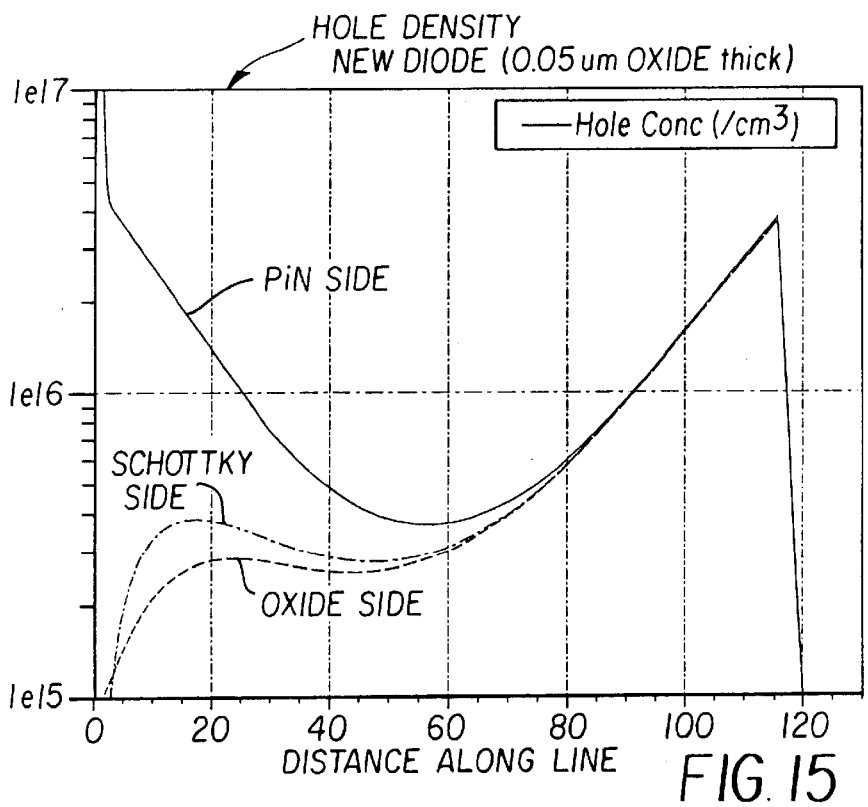
FIG. 15 shows the hole concentration distributions in FIG. 14 in the vertical cross-section including the p-i-n region, the oxide film and the Schottky junction.

FIG. 10 shows the hole concentration distribution in the conventional MPS at the forward current density of 200 Angstroms/$cm^3$. FIG. 11 shows the hole concentration distributions in FIG. 10 in a vertical cross-section including the p-i-n region and including the Schottky junction. FIG. 12 shows the hole concentration distribution in the SD at the forward current density of 200 Angstroms/$cm^3$. FIG. 13 shows the hole concentration distribution of FIG. 12 in a vertical cross-section including the p-i-n region and including the oxide film. FIG. 14 shows the hole concentration distribution in the semiconductor device including an oxide film of 0.05 micrometer in thickness according to the first embodiment of the invention at the forward current density of 200 Angstrom/$cm^3$. FIG. 15 shows the hole concentration distribution of FIG. 14 in the vertical cross-section including the p-i-n region, the oxide film region and the Schottky junction region. In the conventional MPS, the hole concentration decreases around Schottky junction 7. In the SD, although the hole concentration in the region covered with the oxide film is lower than the hole concentration in the p-i-n region, the hole concentration in the region covered with the oxide film is higher than the hole concentration in the cross-section including the Schottky junction in the conventional MPS. Since the oxide film blocks the holes, the carriers are accumulated below the oxide film. Although the semiconductor device according to the first embodiment includes oxide film 6, the hole concentration in the vicinity of the oxide film is as low as the hole concentration in the cross-section including the Schottky junction region.

The mechanisms for causing the above-described hole distributions may be estimated in the following way: Since the region covered with oxide film 6 in the SD is connected to the p-type layer, and since the p-type layer is in contact with anode electrode 4, the holes injected from the p-type layer to the n-type layer reach the region below oxide film 6 with the concentration thereof decreasing exponentially corresponding to the diffusion distances thereof. However, electrons also exist in the region below oxide film 6 to meet the condition of electrical neutrality, and the carriers are blocked by oxide film 6. As a result, carriers are accumulated in the region below oxide film 6. Therefore, although the SD does not include any p-type layer, the carrier concentration in the region below oxide film 6 is not reduced as much in the SD. In the semiconductor devices according to the invention, holes are injected from the p-type layer, but not from Schottky junction 7, since Schottky junction 7 is between the p-type layer and oxide film 6. Due to this configuration, the hole concentration in the region below oxide film 6 is reduced more greatly than that in the SD. Therefore, the holes do not reach the region below the oxide film adjacent to the Schottky junction region, and it is not necessary for electrons to exist in the region below the oxide film to meet the condition of electrical neutrality. Since carriers are not accumulated below oxide film 6, the carrier concentration below the oxide film is as low as the carrier concentration in the Schottky junction region.

One of the most desirable features of the invention will be described below: The area ratio of the p-i-n region in the conventional MPS and the area ratio of the p-i-n region in the semiconductor devices according to the invention are the same, namely, about 50%. However, the area ratio of the Schottky junction region in the semiconductor devices according to the invention is about 25%, while the area ratio of the Schottky junction region in the conventional MPS is about 50%. Although the area ratio of the Schottky junction region in the semiconductor devices according to the invention is half the area ratio of the Schottky junction region in the conventional MPS, the semiconductor devices according to the invention suppresses hole injection in the same extent as the conventional MPS does.

Figure 16:
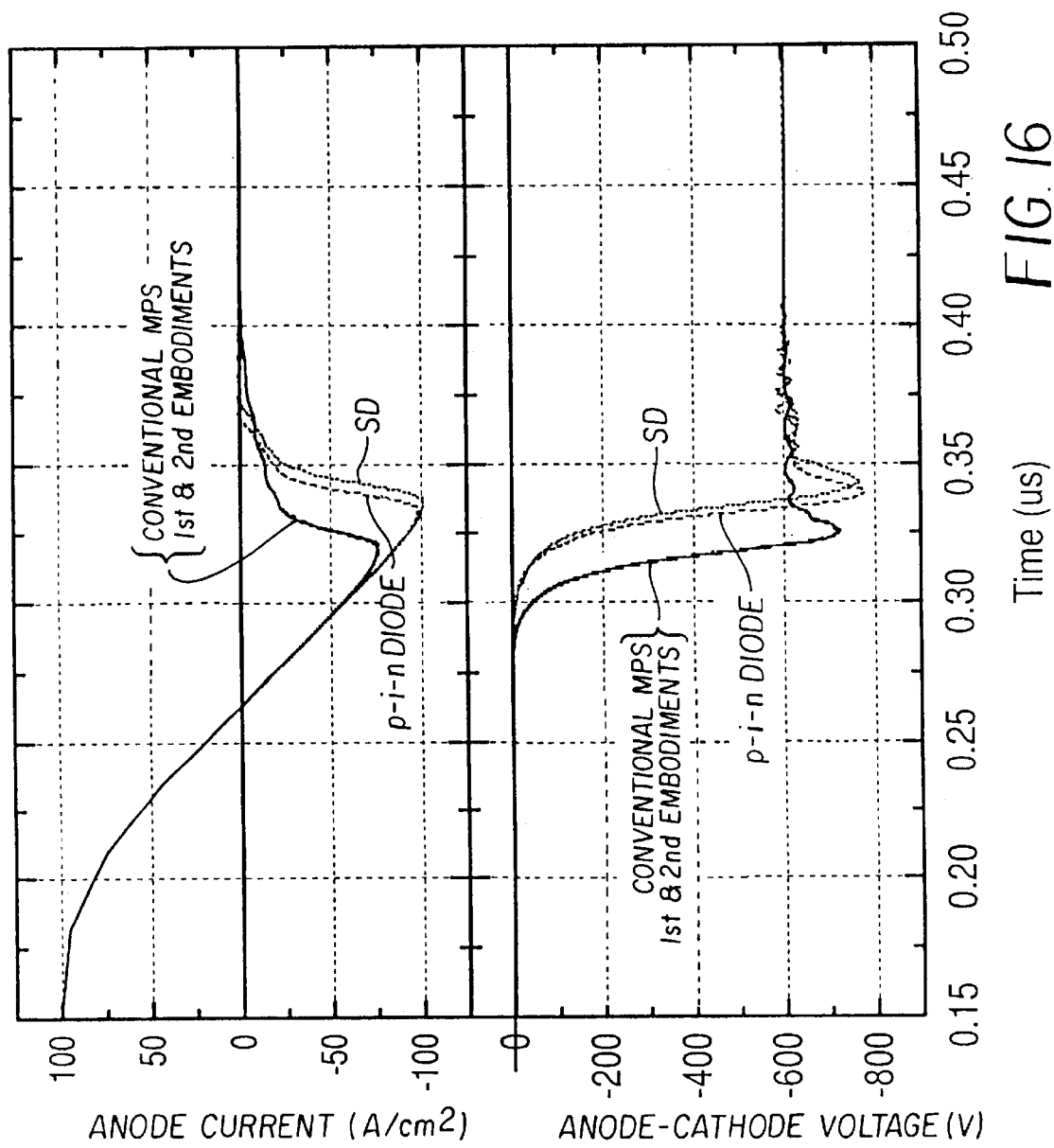
FIG. 16 shows wave forms for comparing the reverse recovery in the conventional p-i-n diode, the conventional MPS, the semiconductor devices according to the first embodiment of the invention (the oxide films thereof are 0.05 micrometer and 1.0 micrometer, respectively), and the SD structure.

The suppression of hole injection affects the reverse recovery characteristics. FIG. 16 shows wave forms for comparing the reverse recovery in the conventional p-i-n diode, the conventional MPS, the semiconductor devices according to the first embodiment of the invention (the oxide films thereof are 0.05 micrometer and 1.0 micrometer, respectively), and the SD structure. As shown in FIG. 16, the semiconductor devices according to the invention exhibit the similar reverse recovery characteristics as those of the conventional MPS irrespective, whether the oxide film used is thick or thin. In other words, the reverse recovery in the semiconductor devices according to the invention is soft (moderate), and the amount of accumulated charge is small. Moreover, the area ratio of the Schottky junction region in the semiconductor devices according to the invention is about half the area ratio of the Schottky junction region in the conventional semiconductor devices. Since the hole injection efficiency in the semiconductor devices according to the invention is reduced at the same rate as the hole injection efficiency in the conventional MPS as described above, the hole concentration on the side of the anode is low in the semiconductor devices according to the invention and the accumulated charge amount is small, resulting in a soft reverse recovery. On the other hand, in the conventional p-i-n diode or in the SD structure, a high peak reverse recovery current and a hard reverse recovery can occur, further causing a high spike voltage. The area ratio of the Schottky junction region and the oxide film region greatly affects the reverse recovery characteristics, such as the peak reverse recovery current.

Figure 17:
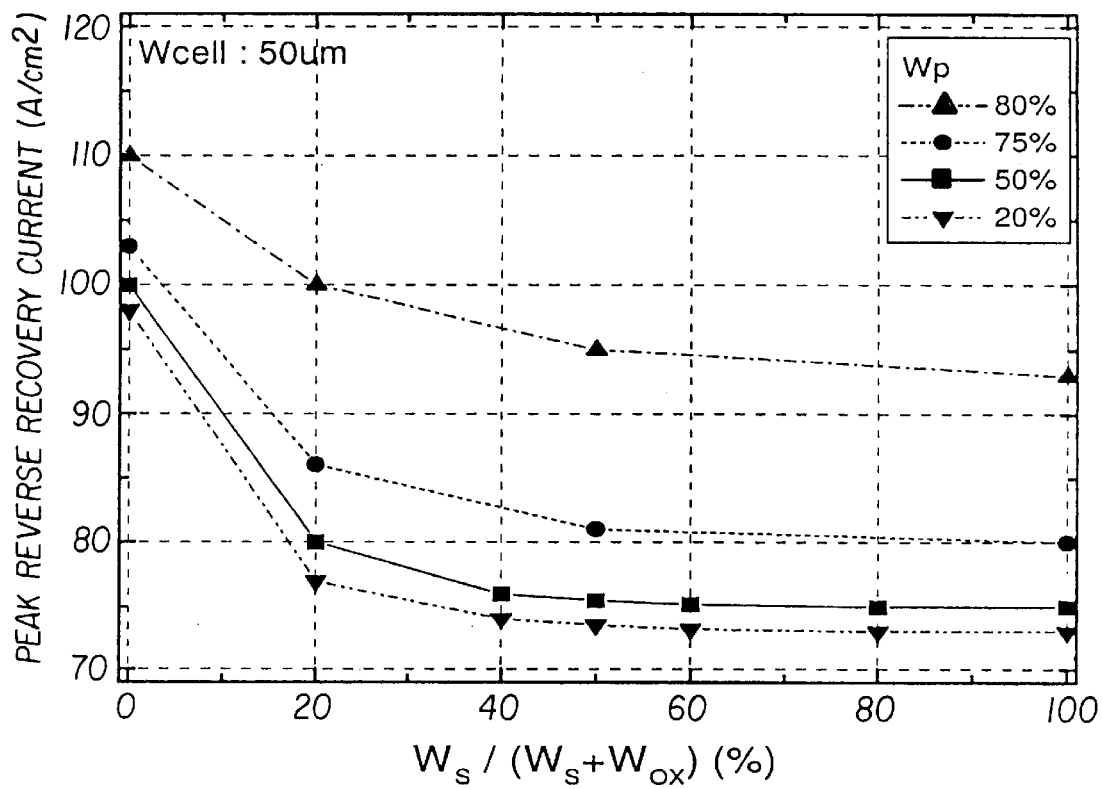
FIG. 17 is a set of curves for showing the dependence of the peak reverse recovery current Jpr on the ratio $W_S/(W_S + W_{OX})$ for the area $W_S$ of the second laminate structure and the total area $W_S + W_{OX}$ of the second laminate structure and the third laminate structure.

FIG. 17 is a set of curves showing the dependence of the peak reverse recovery current Jpr on the ratio $W_S/(W_S+W_{OX})$ for the area $W_S$ of the second laminate structure and the total area $W_S+W_{OX}$ of the second laminate structure and the third laminate structure. The curves in FIG. 17 are drawn for area ratios $W_P/(W_P+W_S+W_{OX})$ varying from about 20 to 80% for the area $W_P$ of the first laminate structure in direct contact with the anode electrode.

Figure 18:
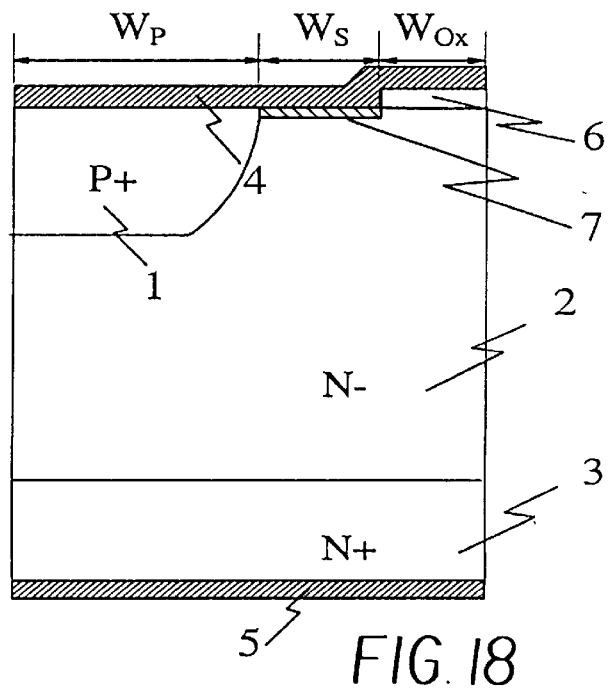
FIG. 18 is a cross-sectional view of a semiconductor stripe structure for explaining the areas $W_P$ of the first laminate structure, $W_S$ of the second laminate structure and $W_{OX}$ of the third laminate structure.

FIG. 18 is a cross-sectional view of a stripe structure for explaining the areas $W_P$, $W_S$ and $W_{OX}$. The same principles apply to the dot cell structure. When the area ratio $W_S/(W_S+W_{OX})$ is less than about 20% at the fixed area ratio $W_P/(W_P+W_S+W_{OX})$ of 50%, the peak reverse recovery current Jpr increases, as shown in FIG. 17. When the area ratio $W_S/(W_S+W_{OX})$ is less than about 20%, the width of the second laminate structure is much less than the carrier diffusion distance Lp or Ln. Due to the very narrow second laminate structure, the effect of the Schottky junction is reduced, and holes are injected from $p^+$-type anode layer 1 with a high efficiency. Due to the reduced effect of the Schottky junction and the high hole injection efficiency, the peak reverse recovery current Jpr increases. The area ratio $W_S/(W_S+W_{OX})$ of about 0% corresponds to the SD structure. When the area ratio $W_S/(W_S+W_{OX})$ is about 20% or more, the peak reverse recovery current Jpr is reduced and almost independent of the area ratio $W_S/(W_S+W_{OX})$. As described above, the semiconductor devices according to the invention exhibits almost the same characteristics as those of the conventional MPS structure, which corresponds to the area ratio $W_S/(W_S+W_{OX})$ of about 100%. Therefore, for obtaining excellent reverse recovery characteristics, it is necessary for the $W_S/(W_S+W_{OX})$ to be about 20% or more. When the area ratio $W_P/(W_P+W_S+W_{OX})$ is about 75% or less, the peak reverse recovery current Jpr is sufficiently small. Therefore, it is desirable for the area ratio $W_P/(W_P+W_S+W_{OX})$ to be 75% or less.

The semiconductor device according to the invention includes a semiconductor chip having a first major surface; a second major surface facing opposite to the first major surface; an anode electrode on the first major surface; a cathode electrode on the second major surface. The semiconductor chip includes a first laminate structure, a second laminate structure and a third laminate structure arranged in parallel to each other, the second laminate structure being interposed between the first laminate structure and the third laminate structure. The first laminate structure, the second laminate structure and the third laminate structure commonly possessing a cathode layer of a first conductivity type contacting the cathode electrode and a drift layer of the first conductivity type on the cathode layer, the drift layer being doped more lightly than the cathode layer. The first laminate structure further includes an anode layer of a second conductivity type on the drift layer, the anode layer being doped more heavily than the drift layer, and the anode layer contacting with the anode electrode. The second laminate structure further includes a Schottky junction between the drift layer and the anode electrode, and the third laminate structure further includes an insulation film between the drift layer and the anode electrode.

When a forward bias voltage is applied to the anode electrode, the carrier concentration in the vicinity of the Schottky junction in the second laminate structure is much smaller than the carrier concentration in the same depth of the first laminate structure, and the efficiency of hole injection from the anode electrode is reduced. Since the Schottky junction region (second laminate structure) is interposed between the first laminate structure and the third laminate structure, the holes injected from the anode layer of the second conductivity type ($p^+$-type anode layer) hardly reach the third laminate structure. As a result, the carrier concentration in the vicinity of the oxide film in third laminate structure is extremely small, even though the oxide film is in the third laminate structure.

When a reverse bias voltage is applied to the diode, depletion layers expand from the pn-junction and the Schottky junction. By covering a part of the Schottky junction with an oxide film according to the invention, especially the region wherein a strong electric field is caused, the reverse leakage current therefrom is reduced and the efficiency of hole injection from the anode electrode is suppressed to a low level.

Since the efficiency of hole injection from the anode electrode is suppressed as low as that of the MPS, the concentration of the holes flowing through the space charge region formed in the first laminate structure (p-i-n region) is also affected, especially when the current changes its direction during reverse recovery. Therefore, the peak reverse recovery current is reduced. Since the total carrier concentration is reduced more greatly than the p-i-n diode, the reverse recovery charges are reduced. Therefore, the peak reverse recovery current Jpr is reduced, resulting in a soft recovery. As a result, a semiconductor device, that exhibits better reverse recovery characteristics and a lower leakage current, is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor chip having a first major surface and a second major surface facing opposite to the first major surface;
   an anode electrode on the first major surface;
   a cathode electrode on the second major surface;
   the semiconductor chip further comprising a first laminate structure, a second laminate structure and a third laminate structure arranged in parallel to each other, the second laminate structure being interposed between the first laminate structure and the third laminate structure;
   wherein the first laminate structure, the second laminate structure and the third laminate structure comprise a common cathode layer of a first conductivity type contacting the cathode electrode and a common drift layer of the first conductivity type on the cathode layer, the drift layer being doped more lightly than the cathode layer;
   wherein the first laminate structure further comprises an anode layer of a second conductivity type on the drift layer, the anode layer being doped more heavily than the drift layer, and the anode layer contacting the anode electrode;
   wherein the second laminate structure further comprises a Schottky junction between the drift layer and the anode electrode; and
   wherein the third laminate structure further comprises an insulation film between the drift layer and the anode electrode.

2. The semiconductor device according to claim 1, wherein the third laminate structure further comprises a float layer of the second conductivity type between the drift layer and the insulation film, wherein the float layer is doped more heavily than the drift layer, the float layer is not in contact with the anode electrode, and the float layer floats electrically from the anode electrode.

3. The semiconductor device according to claim 1, wherein the third laminate structure further comprises a float layer of the second conductivity type between the drift layer and the insulation film, wherein the float layer is doped more heavily than the drift layer, and a part of the float layer is in contact with the anode electrode.

4. The semiconductor device according to claim 1, wherein the first laminate structure and the second laminate structure distribute in a stripe pattern.

5. The semiconductor device according to claim 1, wherein the second laminate structure and the third laminate structure distribute in a stripe pattern.

6. The semiconductor device according to claim 1, wherein the first laminate structure and the second laminate structure distribute in a dot cell pattern.

7. The semiconductor device according to claim 1, wherein the second laminate structure and the third laminate structure distribute in a dot cell pattern.

8. The semiconductor device according to claim 1, wherein the area $W_S$ of the second laminate structure in the first major surface and the area $W_{OX}$ of the third laminate structure in the first major surface are related with each other by the following relational expression (1)

$$0.2 \leq W_S/(W_S+W_{OX}) \qquad (1).$$

9. The semiconductor device according to claim 1, wherein the area $W_P$ of the first laminate structure in the first major surface, the area $W_S$ of the second laminate structure in the first major surface and the area $W_{OX}$ of the third laminate structure in the first major surface are related with each other by the following relational expression $$W_P(W_P+W_S+W_{OX}) \leq 0.75 \qquad (2).$$

10. The semiconductor device according to claim 1, wherein the insulation film comprises a silicon oxide film.

11. The semiconductor device according to claim 10, wherein the silicon oxide film is from 0.01 to 1.0 micrometers in thickness.

12. The semiconductor device according to claim 1, wherein the insulation film comprises a polyimide film.

13. The semiconductor device according to claim 12, wherein the polyimide film is from 0.01 to 1.0 micrometer in thickness.

14. The semiconductor device according to claim 2, wherein the area $W_S$ of the second laminate structure in the first major surface and the area $W_{OX}$ of the third laminate structure in the first major surface are related with each other by the following relational expression (1)

$$0.2 \leq W_S/(W_S+W_{OX}) \qquad (1).$$

15. The semiconductor device according to claim 2, wherein the area $W_P$ of the first laminate structure in the first major surface, the area $W_S$ of the second laminate structure in the first major surface and the area $W_{OX}$ of the third laminate structure in the first major surface are related with each other by the following relational expression $$W_P(W_P+W_S+W_{OX}) \leq 0.75 \qquad (2).$$

16. The semiconductor device according to claim 3, wherein the area $W_S$ of the second laminate structure in the first major surface and the area $W_{OX}$ of the third laminate structure in the first major surface are related with each other by the following relational expression (1)

$$0.2 \leq W_S/(W_S+W_{OX}) \qquad (1).$$

17. The semiconductor device according to claim 3, wherein the area $W_P$ of the first laminate structure in the first major surface, the area $W_S$ of the second laminate structure in the first major surface and the area $W_{OX}$ of the third laminate structure in the first major surface are related with each other by the following relational expression $$W_P(W_P+W_S+W_{OX}) \leq 0.75 \qquad (2).$$

* * * * *